United States Patent [19]

Matsui

[11] Patent Number: 4,825,185

[45] Date of Patent: Apr. 25, 1989

[54] ELECTRIC NOISE ABSORBER

[75] Inventor: Kazuhiro Matsui, Toyoake, Japan

[73] Assignee: Kitagawa Industries Co., Ltd., Aichi, Japan

[21] Appl. No.: 152,859

[22] Filed: Feb. 5, 1988

[30] Foreign Application Priority Data

Feb. 19, 1987 [JP] Japan .................. 62-36828

[51] Int. Cl.$^4$ .............. H01F 17/06; H01F 27/02; H01F 27/26

[52] U.S. Cl. ...................... 336/92; 324/127; 333/12; 336/175; 336/212; 336/233

[58] Field of Search ........... 174/92; 324/127; 333/81 R, 12, 182, 243, 183, 174; 336/175, 176, 229, 212, 90, 210, 92, 233

[56] References Cited

U.S. PATENT DOCUMENTS

| | | | |
|---|---|---|---|
| 1,555,066 | 9/1925 | Lines | 336/176 |
| 3,199,026 | 8/1965 | Leibowitz | 324/127 |
| 3,219,930 | 11/1965 | Sipler | 324/127 X |
| 3,229,030 | 1/1966 | Baermann | 174/117 F |
| 3,241,198 | 3/1966 | Baermann | 335/303 |
| 3,314,009 | 4/1967 | Murdock | 324/127 X |
| 3,462,715 | 8/1969 | Schor | 333/183 |
| 3,514,731 | 5/1970 | Drake | 335/285 |
| 3,516,026 | 6/1970 | Curran et al. | 333/12 |
| 3,711,632 | 1/1973 | Ghinardi | 174/92 X |
| 3,838,213 | 9/1974 | Georgopulos et al. | 174/92 X |
| 3,846,725 | 11/1974 | Mears, Jr. | 336/208 X |
| 4,049,357 | 9/1977 | Hamisch, Jr. | 174/92 X |
| 4,336,806 | 6/1982 | Eldrigde, Jr. | 128/348 |
| 4,426,108 | 1/1984 | Kesselman | 174/92 X |
| 4,435,612 | 3/1984 | Smith | 174/92 |
| 4,559,496 | 12/1985 | Harnden, Jr. et al. | 324/127 |

FOREIGN PATENT DOCUMENTS

| | | | |
|---|---|---|---|
| 624455 | 1/1936 | Fed. Rep. of Germany | 336/176 |
| 11729 | 9/1956 | Fed. Rep. of Germany | 336/176 |
| 129316 | 10/1979 | Japan | 336/176 |
| 60-16404 | 1/1985 | Japan . | |
| 61-138714 | 3/1986 | Japan . | |
| 61-176626 | 5/1986 | Japan . | |
| 61-97899 | 6/1986 | Japan . | |
| 61-116021 | 7/1986 | Japan . | |
| 2179502 | 3/1987 | United Kingdom . | |

Primary Examiner—Thomas J. Kozma
Attorney, Agent, or Firm—Oliff & Berridge

[57] ABSTRACT

An electric noise absorber for attaching to a wire of an electronic device comprises a magnetic body divided into parts, a holding case composed of two case members and a locking device for preventing a movement of the magnetic body in the holding case. Each abutment surface of the two parts of the magnetic body cut by a cutting plane are sufficiently larger in area than a basic cross section of the magnetic body in order to prevent magnetic resistance of the abutment surface from being increased. Further, the dislocation of the two parts of the magnetic body can be prevented by the locking device. As a result, the magnetic body is securely held in the holding case to absorb noise current effectively.

11 Claims, 3 Drawing Sheets

ELECTRIC NOISE ABSORBER

BACKGROUND OF THE INVENTION

1. Field of the Invention

The present invention relates to an electric noise absorber and, in particular, to an electric noise absorber attached to an electric wire of an electronic device for absorbing electric noise which is generated internally or which enters the device through the wire from the outside.

2. Prior Art

As a method for absorbing such noise, it is well-known that magnetic ferrite is attached to a wire. In this method, two parts of half ring-shaped ferrite are simply attached to the wire by wrapping an adhesive tape around the ferrite, therefore, after drawing out or a period of time, the ferrite is apt to easily become separated from the wire. Moreover, it is troublesome to attach the two half separate parts to the wire or to detach them. When a conductive ferrite is employed, it may make a short circuit or may generate a contact electricity in the electronic device. Furthermore, a closed magnetic circuit formed in two parts of half ring-shaped ferrite is apt to be broken at separate abutment surfaces. Especially, when an air gap is generated between the separate abutment surfaces of the ferrite or when the area of the separate abutment surfaces is reduced due to dislocation thereof, there arises a problem that the noise absorbing effect is decreased due to the increase of magnetic resistance.

SUMMARY OF THE INVENTION

It is an object of the present invention to provide an electric noise absorber in which a magnetic body can be held securely to a wire for an extended period of time.

It is another object of the present invention to provide an electric noise absorber which can easily be attached to and detached from the wire, when required.

It is a further object of the present invention to provide an electric noise absorber which can prevent magnetic resistance at an abutment surface of the magnetic body from being increased.

It is a still further object of the present invention to provide an electric noise absorber which can effectively absorb electric noise and prevent the noise from entering into the electronic device through the wire.

The foregoing objects will be attained by providing an electric noise absorber comprising: a tubular magnetic body having therein a longitudinal through hole for securely receiving a wire of an electronic device and divided longitudinally by at least a cutting plane into two parts, each of the two parts including a half through hole and two abutment surfaces, each of the abutment surfaces being sufficiently larger in area than a basic cross section of the magnetic body; a holding device for holding the magnetic body under the condition that the two parts of the magnetic body closely abut to each other through the abutmentsurfaces, the holding device including two hinged and detachably connected case members for respectively housing therein the two parts of the magnetic body; and a locking device attached to said magnetic body and the holding device for preventing a movement of the magnetic body in said holding device.

In such an electric noise absorber, manganese zinc or nickel zinc ferrite is preferable as the magnetic body. Metallic core such as silicone steel or dust core such as molybdenum may also be used. The magnetic body is longitudinally divided into two parts for clamping the wire and is formed ring-shaped, disc-shaped or cylinder-shaped, including a through hole in the center thereof for receiving the wire. The periphery of each divided magnetic body is provided with a projection or a recess. A holding case having two case members for holding two parts of the magnetic body therein is integrally made of resilient synthetic resin, each side of the case member including engaging portions to engage with the projection or the recess of the magnetic body and being interlocked when put together end to end. Both sides of case members are provided with engaging projections or recesses which receive the engaging projections to interlock the both case members. Further, the two case members can be opened and closed via a hinge which is provided on one end of each case member. In this case, two case members are interlocked at their free ends by an engaging projection attached to one case member and a recess attached to the opposite case member.

BRIEF DESCRIPTION OF THE DRAWINGS

Other objects and features of the invention will become apparent to those skilled in the art as the disclosure is made in the following invention, as illustrated on the accompanying drawings.

DETAILED DESCRIPTION OF THE PREFERRED EMBODIMENT

Hereinafter, the preferred embodiments of the present invention will be described in detail with reference to the drawings.

Figure 1:
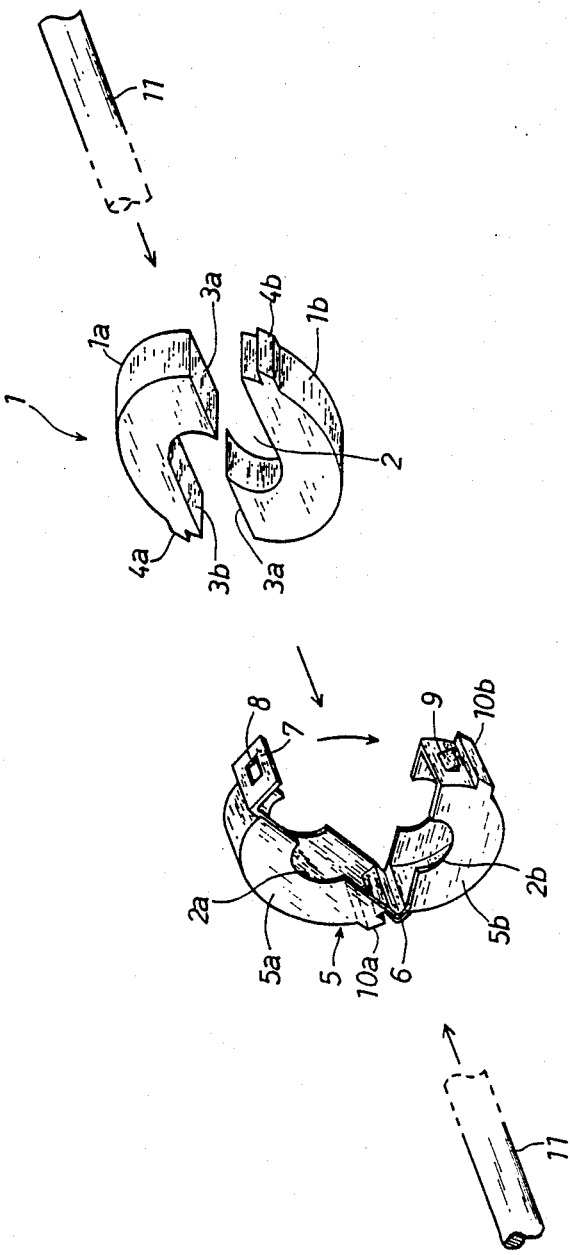
FIG. 1 is an exploded view in perspective of an electric noise absorber as the first embodiment of the invention.
Figure 2:
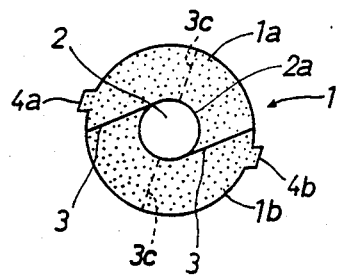
FIG. 2 is a front view of a magnetic body of the first embodiment.

In this electric noise absorber, a magnetic body 1 is held in a holding case 5. As shown in FIG. 2, the magnetic body 1 is a circular ring-shaped ferrite including a through hole 2 in the center thereof for receiving an electric wire 11 and is divided into an upper part 1a and a lower part 1b by cutting planes 3 and 3 which are extending in parallel in the opposite direction to each other from the contact points of a periphery 2a of the through hole 2. The diameter of the through hole 2 is a little smaller than that of the wire 11.

Further, separate abutment surfaces 3a and 3b cut by the cutting planes 3 and 3 are sufficiently larger in area than a cross section 3c of the magnetic body 1 cut along the radius direction. The cross section 3c is called a basic cross section and has the minimum longitudinal cut area of all longitudinally bisected parts of the magnetic body 1. As a result, when a closed magnetic circuit is formed in the circular ring-shaped magnetic body 1, magnetic resistance can be decreased at the separate abutment surfaces 3a and 3b where the magnetic resistance is generally apt to be increased.

4a and 4b respectively denote projections which are provided at opposite positions of the peripheries of the upper and lower parts 1a and 1b of the magnetic body 1. The upper and lower parts 1a and 1b may be made of materials having different noise absorbing ranges to extend the noise absorbing range of the magnetic body 1. The holding case 5 includes an upper case member 5a and a lower case member 5b for holding the upper and lower parts 1a and 1b therein, respectively. The upper and lower case members 5a and 5b are integrally made of synthetic resin such as nylon and polyethylene, and are hinged at one end by a hinge 6 to prevent their separation and to provide them to be easily opened and closed. At a free end of the upper case member 5a is provided an engaging tab 7 extending outwardly by a length substantially equal to a thickness of the holding case 5 and then extending downwardly, which has a rectangular aperture 8. An engaging projection 9 whose section is triangle is provided on the outside wall of the free end of the lower case member 5b. When the both case members 5a and 5b are put together, the engaging projection 9 of the lower case member 5b is inserted into the rectangular aperture 8 to engage therewith, resulting in a secure joint of the upper and lower case members 5a and 5b. The upper and lower case members 5a and 5b of the holding case 5 respectively include cavities 2a and 2b in the center thereof for receiving the wire 11.

Figure 3:
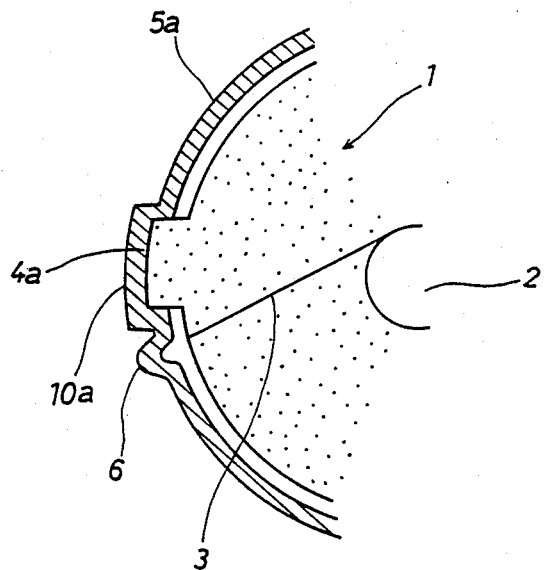
FIG. 3 is a partially enlarged view illustrating the state that a projection of the magnetic body engages with an engaging portion of a holding case.
Figure 4:
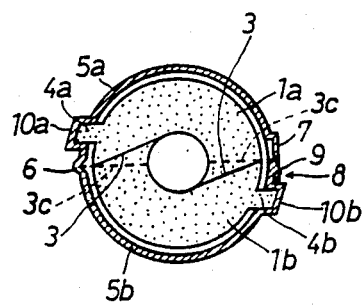
FIG. 4 is a section view of the electric noise absorber.

Outwardly directed channel-shaped engaging portions 10a and 10b of the holding case 5 are formed to engage with the projections 4a and 4b provided on the periphery of the magnetic body 1, respectively. In such holding case 5, the upper and lower case members 5a and 5b hold the upper and lower parts 1a and 1b therein, respectively. In addition, the projections 4a and 4b are engaged with the engaging portions 10a and 10b, respectively. FIG. 3 is a partially enlarged view illustrating the state that the projection 4a engages with the engaging portion 10a. As shown in FIG. 4, under such state, the rectangular aperture 8 and the engaging projection 9 provided at the free ends of the holding case 5 are engaged with each other for clamping the wire 11. At this time, the projections 4a and 4b of the magnetic body 1 engage with the engaging portions 10a and 10b in the holding case 5, respectively, thereby, avoiding the disclocation of the separate abutment surfaces 3a and 3b. The magnetic body 1, thus, is securely held in the holding case 5 without reduction of the area of the separate abutment surfaces 3a and 3b due to the disclocation thereof.

Such electric noise absorber is so attached to the wire 11 as to surround it for absorbing noise current flowing in the wire 11 with the help of the magnetic body 1. It is preferable that the most appropriate number and position of the electric absorber which is attached to the wire 11 are determined by measuring the noise absorbing efficiency with a noise measuring device. Each of the case members 5a and 5b may have the engaging tab 7 with the rectangular aperture 8 on one side and the engaging projection 9 at the symmetrical position to the engaging tab 7 on the other side so that they can be engaged opposite to each other. In addition, the upper case member 5a and the lower case member 5b may have the engaging projections 9 and the rectangular apertures 8 on the both sides, respectively so that they can be engaged opposite to each other.

Figure 5:
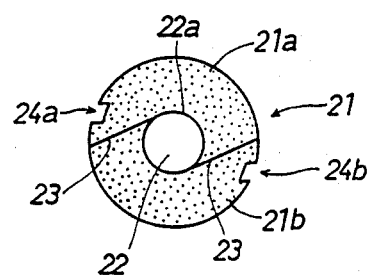
FIG. 5 is a front view of a magnetic body as the second embodiment of the invention.
Figure 6:
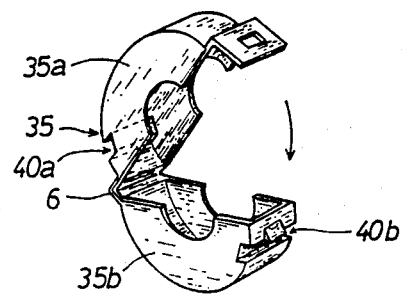
FIG. 6 is a perspective view of a holding case of the second embodiment.

Referring to FIGS. 5 and 6, there are shown a magnetic body 21 and a holding case 35 of an electric noise absorber as the second embodiment of the invention. The magnetic body 21 as well as the magnetic body 1 of the first embodiment is a circular ring-shaped ferrite including a through hole 22 in the center thereof for receiving the wire 11 and is divided into an upper part 21a and a lower part 21b by cutting planes 23 and 23 which are extending in parallel in the opposite directions to each other from contact points of a periphery 22a of the through hole 22. On each periphery of the upper and lower parts 21a and 21b of the magnetic body 21 are provided recesses 24a and 24b, respectively. The holding case 35 as well as the holding case 5 includes an upper case member 35a and a lower case member 35b which are connected by the hinge 6 so as to be opened and closed. The upper and lower case members 35a and 35b of the holding case 35 have engaging portions 40a and 40b, respectively, which are projecting inwardly from the holding case 35 to engage with the recesses 24a and 24b of the magnetic body 21, respectively. Thus, the magnetic body 21 is securely held in the holding case 35 without the dislocation, resulting in avoiding the reduction of the area of the separate abutment surfaces.

Obviously, many modifications and variations of the present invention are possible as pointed out with regard to the above revelations. It is therefore to be understood that within the scope of the appended claims, the invention may be practiced otherwise than as specifically described.

What is claimed is:

1. An electric noise absorber comprising:
    a tubular magnetic body having therein a longitudinal through hole for securely receiving a wire of an electronic device and divided longitudinally by at least a cutting plane into two parts, each of said two parts including a half through hole and two abutment surfaces, each of said abutment surfaces being sufficiently larger in area than a basic cross section of said magnetic body;
    a holding device for holding said magnetic body under the condition that said two parts of said magnetic body closely abut to each other through said abutment surfaces, said holding device including two hinged and detachably connected case members for respectively housing therein two parts of said magnetic body; and
    a locking device attached to said magnetic body and said holding device for preventing a movement of said magnetic body in said holding device, said locking device including one of a projection and recess located on the magnetic body and the other of said projection and recess located on the holding device, said projection cooperating with the recess to maintain each part of said magnetic body in a corresponding case member when said case members are detached from one another.

2. An electric noise absorber as claimed in claim 1, wherein said locking device comprises said projection projecting outwardly from a periphery of each part of said magnetic body and said recess is an outwardly directed engaging portion attached to a periphery of each of said case members for housing therein said projection of said magnetic body, and said projections are disposed at opposite positions on said periphery of said magnetic body.

3. An electric noise absorber as claimed in claim 1, wherein said locking device comprises said recess disposed on the periphery of said each part of said magnetic body and said projection is an engaging portion projecting inwardly from the periphery of each case member of said holding device, said engaging portion is received in said recess of said magnetic body and said recesses are disposed at opposite positions on said periphery of said magnetic body.

4. An electric noise absorber as claimed in claim 1, wherein said two case members of said holding device are connected by said hinge at one end thereof and detachably connected by an engaging projection and a locking aperture at free ends thereof, said engaging projection is attached to one of two case members and said aperture is disposed on the other case member.

5. An electric noise absorber as claimed in claim 4, wherein said locking aperture has a rectangular shape and is formed on a vertical portion of a projecting piece which projects outwardly by a length substantially equal to a thickness of said case member from said free end of one of said case member of said holding device and then extends vertically and downwardly.

6. An electric noise absorber as claimed in claim 5, wherein said engaging projection has a triangular shape in a section.

7. An electric noise absorber as claimed in claim 4, wherein said holding device has a circular cross section and is divided by a plane including a diameter of said circular cross section into said two case members.

8. An electric noise absorber as claimed in claim 1, wherein said magnetic body is a circular tube and said cutting planes of said magnetic body are two parallel planes contacting to a periphery of said through hole and extending oppositely and outwardly from each contact point to said periphery.

9. An electric noise absorber as claimed in claim 1, wherein said magnetic body is made of ferrite.

10. An electric noise absorber as claimed in claim 1, wherein said holding device is made of synthetic resin.

11. The electric noise absorber of claim 1 in which said holding device holds an outer portion of the magnetic body while leaving an inner through hole portion exposed to allow the holding device to hold the magnetic body closely adjacent to a wire.

* * * * *